(12) United States Patent
Lu

(10) Patent No.: US 12,408,329 B2
(45) Date of Patent: Sep. 2, 2025

(54) METHOD FOR MANUFACTURING SEMICONDUCTOR STRUCTURE, SEMICONDUCTOR STRUCTURE, AND SEMICONDUCTOR MEMORY

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 441 days.

(21) Appl. No.: 18/150,306

(22) Filed: Jan. 5, 2023

(65) Prior Publication Data

US 2023/0157008 A1 May 18, 2023

Related U.S. Application Data

(63) Continuation of application No. PCT/CN2022/071111, filed on Jan. 10, 2022.

(30) Foreign Application Priority Data

Nov. 4, 2021 (CN) .......................... 202111301855.4

(51) Int. Cl.
H10B 12/00 (2023.01)
(52) U.S. Cl.
CPC .......... *H10B 12/485* (2023.02); *H10B 12/02* (2023.02); *H10B 12/482* (2023.02)
(58) Field of Classification Search
None
See application file for complete search history.

(56) References Cited

U.S. PATENT DOCUMENTS

| | | | |
|---|---|---|---|
| 11,133,246 B1* | 9/2021 | Chen | ................. H01L 23/49844 |
| 11,152,364 B1* | 10/2021 | Lin | ...................... H10D 30/475 |
| 2006/0022256 A1* | 2/2006 | Lee | ........................ H10D 1/042 |
| | | | 257/E21.582 |
| 2017/0098652 A1 | 4/2017 | Kang et al. | |

(Continued)

FOREIGN PATENT DOCUMENTS

| CN | 108666263 A | 10/2018 |
|---|---|---|
| CN | 111430226 A | 7/2020 |

(Continued)

*Primary Examiner* — Steven M Page
(74) *Attorney, Agent, or Firm* — Syncoda LLC; Feng Ma

(57) ABSTRACT

A method for manufacturing a semiconductor structure, a semiconductor structure, and a semiconductor memory are provided. The method includes: providing a substrate, the substrate including a plurality of active areas; forming bit line contact mask structures above the plurality of active areas, each bit line contact mask structure at least covering one active area terminal; performing downward etching along the bit line contact mask structures to form a node contact hole in the active area terminal, and filling the node contact hole with a semiconductor material to form a first node contact structure; and forming a plurality of bit line structures above the plurality of active areas, and continuously filling gaps between the plurality of bit line structures with the semiconductor material until a second node contact structure is formed, the first node contact structure and the second node contact structure collectively forming a node contact structure.

15 Claims, 18 Drawing Sheets

(56) References Cited

U.S. PATENT DOCUMENTS

2018/0047732 A1*  2/2018  Kim .................. H10B 12/0335
2020/0203354 A1*  6/2020  Lee ...................... H10B 12/02
2022/0093584 A1*  3/2022  Lee ...................... H01L 21/765

FOREIGN PATENT DOCUMENTS

| CN | 112992792 A | 6/2021 |
| CN | 113314469 A | 8/2021 |
| CN | 113506776 A | 10/2021 |

* cited by examiner

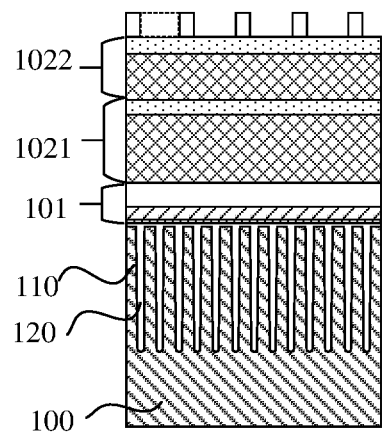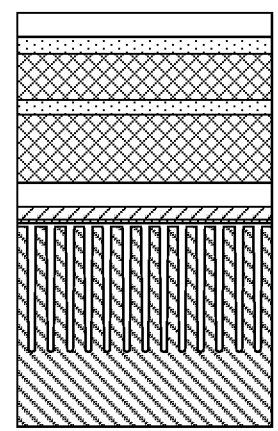
FIG. 8A  FIG. 8B
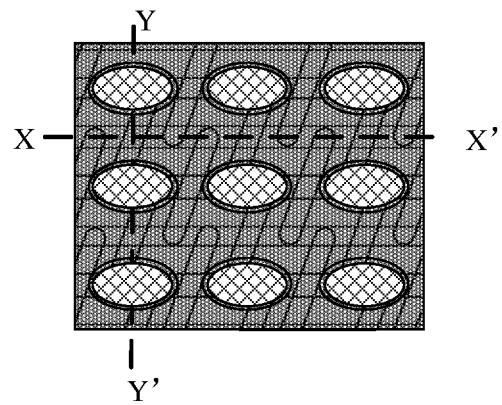
FIG. 9A
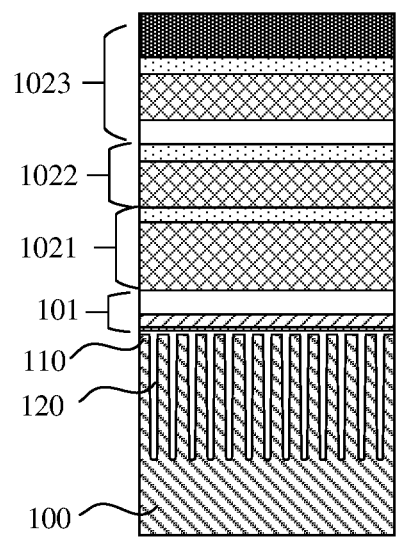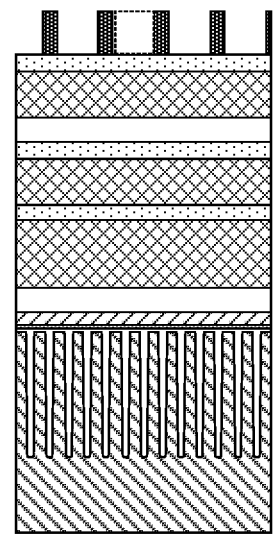
FIG. 9B  FIG. 9C

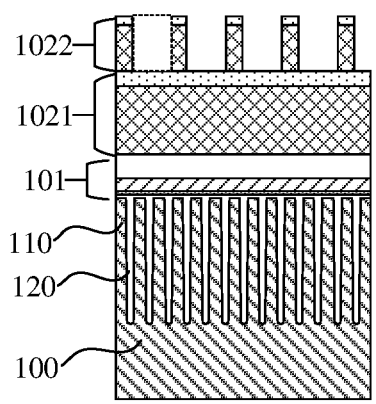 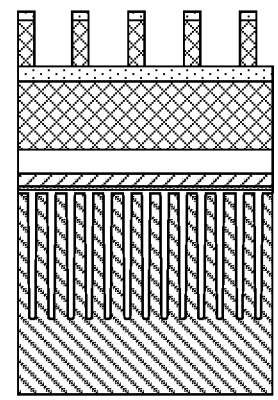
FIG. 11B  FIG. 11C
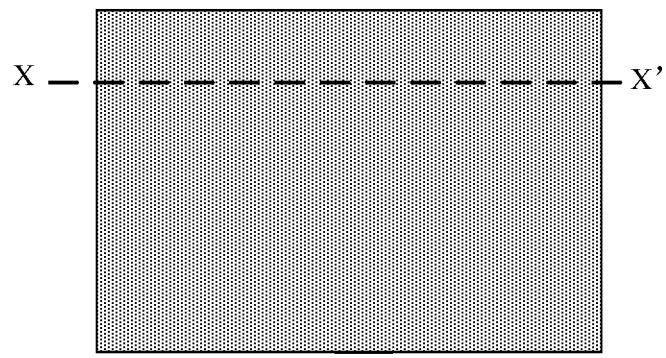
FIG. 12A

METHOD FOR MANUFACTURING SEMICONDUCTOR STRUCTURE, SEMICONDUCTOR STRUCTURE, AND SEMICONDUCTOR MEMORY

CROSS-REFERENCE TO RELATED APPLICATIONS

This is a continuation application of International Patent Application No. PCT/CN2022/071111, filed on Jan. 10, 2022, which claims priority to Chinese Patent Application No. 202111301855.4, filed on Nov. 4, 2021 and entitled "METHOD FOR MANUFACTURING SEMICONDUCTOR STRUCTURE, SEMICONDUCTOR STRUCTURE, AND SEMICONDUCTOR MEMORY". The disclosures of International Patent Application No. PCT/CN2022/071111 and Chinese Patent Application No. 202111301855.4 are incorporated by reference herein in their entireties.

BACKGROUND

During manufacturing a semiconductor, the manufacture of a Node Contact (NC) structure is often involved. In the related art, it is generally necessary to continuously deepen a hole in a direction of an NC hole towards a substrate after a bit line structure is manufactured, and to fill polysilicon to form an NC structure. However, in the above manufacturing process, the NC hole is relatively narrow and long, so that gaps will be easily generated when polysilicon is filled, resulting in degradation of the electrical properties of the semiconductor.

SUMMARY

The disclosure relates to the technical field of semiconductor manufacturing, and in particular to a method for manufacturing a semiconductor structure, a semiconductor structure, and a semiconductor memory.

Technical solutions of the disclosure are implemented as follows.

In a first aspect, the embodiments of the disclosure provide a method for manufacturing a semiconductor structure. The method includes the following operations.

A substrate is provided, in which the substrate includes a plurality of active areas.

A plurality of bit line contact mask structures are formed above the plurality of active areas, in which each of the plurality of bit line contact mask structures at least covers one active area terminal.

Downward etching is performed along the plurality of bit line contact mask structures to form a node contact hole in the active area terminal, and the node contact hole is filled with a semiconductor material to form a first node contact structure.

A plurality of bit line structures are formed above the plurality of active areas, and gaps between the plurality of bit line structures are continuously filled with the semiconductor material until a second node contact structure is formed, in which the first node contact structure and the second node contact structure collectively form a node contact structure.

In a second aspect, the embodiments of the disclosure provide a semiconductor structure. The semiconductor structure is manufactured by a method for manufacturing a semiconductor structure. The method for manufacturing the semiconductor structure includes the following operations.

A substrate is provided, in which the substrate includes a plurality of active areas.

A plurality of bit line contact mask structures are formed above the plurality of active areas, in which each of the plurality of bit line contact mask structures at least covers one active area terminal.

Downward etching is performed along the plurality of bit line contact mask structures to form a node contact hole in the active area terminal, and the node contact hole is filled with a semiconductor material to form a first node contact structure.

A plurality of bit line structures are formed above the plurality of active areas, and gaps between the plurality of bit line structures are continuously filled with the semiconductor material until a second node contact structure is formed, in which the first node contact structure and the second node contact structure collectively form a node contact structure.

In a third aspect, the embodiments of the disclosure provide a semiconductor memory. The semiconductor memory includes a semiconductor structure. The semiconductor structure is manufactured by a method for manufacturing a semiconductor structure. The method for manufacturing the semiconductor structure includes the following operations.

A substrate is provided, in which the substrate includes a plurality of active areas.

A plurality of bit line contact mask structures are formed above the plurality of active areas, in which each of the plurality of bit line contact mask structures at least covers one active area terminal.

Downward etching is performed along the plurality of bit line contact mask structures to form a node contact hole in the active area terminal, and the node contact hole is filled with a semiconductor material to form a first node contact structure.

A plurality of bit line structures are formed above the plurality of active areas, and gaps between the plurality of bit line structures are continuously filled with the semiconductor material until a second node contact structure is formed, in which the first node contact structure and the second node contact structure collectively form a node contact structure.

BRIEF DESCRIPTION OF THE DRAWINGS

FIG. 8A is a fourth schematic diagram of a process for manufacturing a bit line contact mask structure according to an embodiment of the disclosure;

FIG. 8B is a fifth schematic diagram of a process for manufacturing a bit line contact mask structure according to an embodiment of the disclosure;

FIG. 9A is a sixth schematic diagram of a process for manufacturing a bit line contact mask structure according to an embodiment of the disclosure;

FIG. 9B is a seventh schematic diagram of a process for manufacturing a bit line contact mask structure according to an embodiment of the disclosure;

FIG. 9C is an eighth schematic diagram of a process for manufacturing a bit line contact mask structure according to an embodiment of the disclosure;

FIG. 11B is a thirteenth schematic diagram of a process for manufacturing a bit line contact mask structure according to an embodiment of the disclosure;

FIG. 11C is a fourteenth schematic diagram of a process for manufacturing a bit line contact mask structure according to an embodiment of the disclosure;

FIG. 12A is a fifteenth schematic diagram of a process for manufacturing a bit line contact mask structure according to an embodiment of the disclosure;

DETAILED DESCRIPTION

Figure 1A:
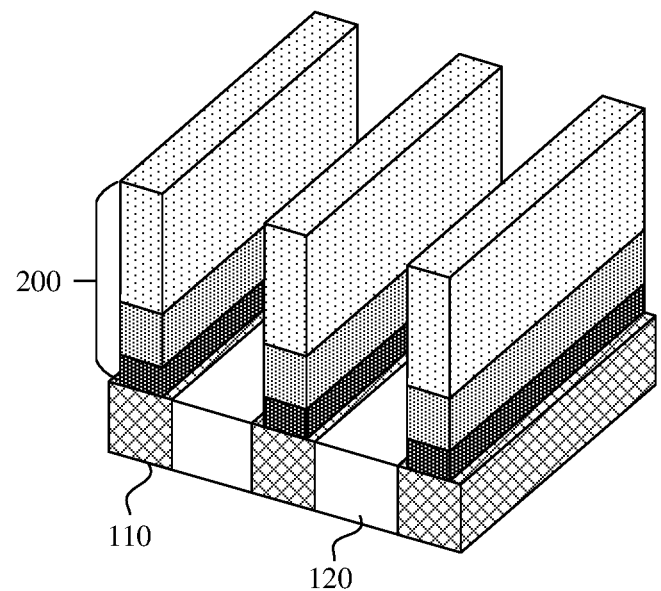
FIG. 1A is a first schematic diagram of a process for manufacturing a node contact structure in the related art.

The technical solutions in the embodiments of the disclosure are clearly and completely described below in combination with the accompanying drawings in the embodiments of the disclosure. It can be understood that the specific embodiments described herein are merely used to explain the disclosure, but are not intended to limit the disclosure. In addition, it should be noted that, for ease of description, only the parts related to the relevant disclosure are shown in the accompanying drawings.

Unless defined otherwise, all technical and scientific terms used herein have the same meaning as commonly understood by those skilled in the art to which the disclosure belongs. The terminology used herein is only intended to describe the embodiments of the disclosure, and is not intended to limit the disclosure.

In the following description, the expression "some embodiments" is involved, which describes subsets of all possible embodiments. However, it should be understood that, "some embodiments" may be same subset or different subsets of all possible embodiments, and may be combined with each other without conflict.

It should be pointed out that terms "first/second/third" involved in the embodiments of the disclosure may only be used to distinguish similar objects, without indicating any specific ordering for objects. It can be understood that "first/second/third" may be interchanged in a specific order or sequence where it is permitted, so that the embodiments of the disclosure described herein may be implemented in an order other than those illustrated or described herein.

It can be understood that in order to make the objectives, technical solutions, and advantages of the disclosure more apparent, hereinafter, the respective embodiments of the disclosure will be described in detail with reference to the accompanying drawings. However, those of ordinary skill in the art can understand that, in the respective embodiments of the disclosure, numerous technical details are set forth in order to provide a reader with a better understanding of the disclosure. However, the technical solutions claimed in the disclosure can also be implemented without these technical details and various changes and modifications based on the respective embodiments below.

The meanings of some terms and abbreviations in the embodiments of the disclosure are as follows.

NC: Node Contact
BLC: Bit Line Contact
BLC Mask: Bit Line Contact Mask
BL: Bit Line
Oxide: In the embodiments of the disclosure, it indicates that silicon is oxidized, i.e., silicon oxide
PR: Photo Resist
SOH: Spin on Hardmask
DRAM: Dynamic Random Access Memory
SRAM: Static Random Access Memory
NAND: computer flash memory device It should be understood that the manufacture of the NC structure is usually involved during manufacturing of the semiconductor. With reference to FIG. 1A to FIG. 1D, FIG. 1A to FIG. 1D illustrate schematic diagrams of a process for manufacturing a node contact structure in the related art. The process for manufacturing the node contact structure includes the following operations.

(1) A plurality of bit line structures are formed. As shown in FIG. 1A, a plurality of bit line structures 200 are formed on a substrate (not shown in the figures) including a plurality of active areas 110 and a shallow trench isolation structure 120.

Figure 1B:
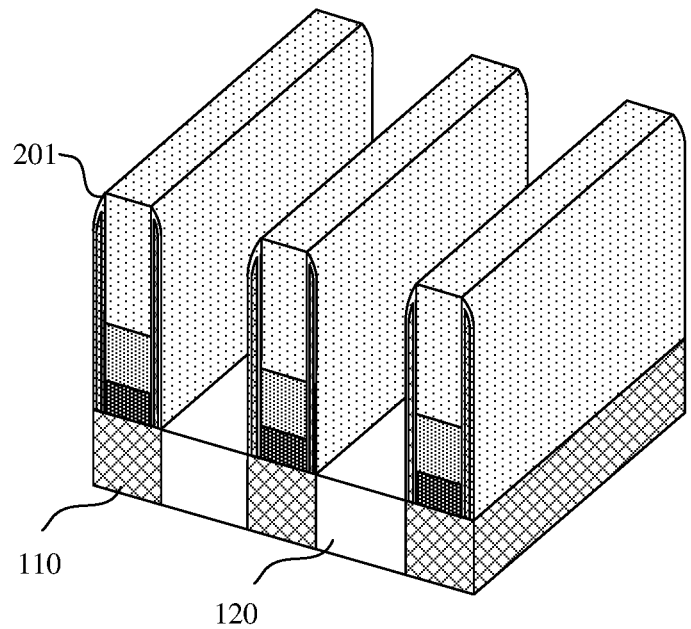
FIG. 1B is a second schematic diagram of a process for manufacturing a node contact structure in the related art.

(2) A covering layer is formed. As shown in FIG. 1B, a silicon nitride layer, a silicon oxide layer, and a silicon nitride layer are sequentially formed on an outer side of each bit line structure 200, so as to form a covering layer 201.

Figure 1C:
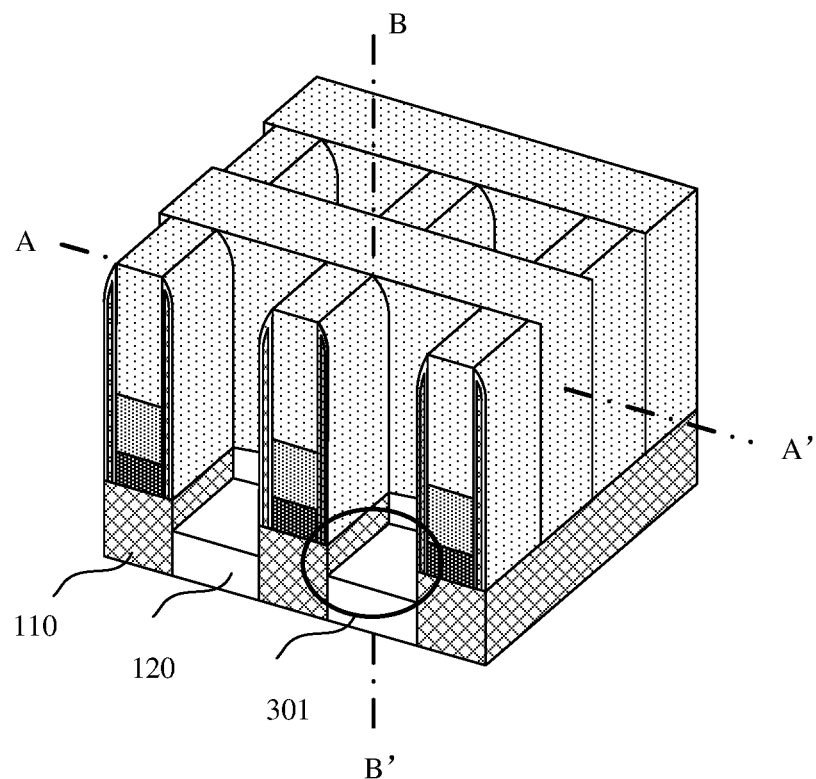
FIG. 1C is a third schematic diagram of a process for manufacturing a node contact structure in the related art.
Figure 2:
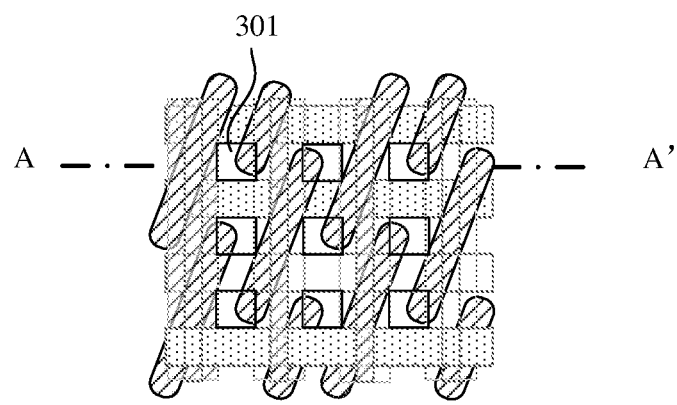
FIG. 2 is a schematic diagram of a node contact hole in the related art.

(3) A plurality of node contact holes (Storage Node Contact Holes, NC holes) are formed. As shown in FIG. 1C, some silicon oxide structures are continuously formed, so as to divide the plurality of bit line structure 200 into a plurality of gaps. Bottom portions of the gaps are the node contact holes 301. With reference to FIG. 2, FIG. 2 illustrates a schematic diagram of a node contact hole 301 in the related art. Particularly, FIG. 2 is a sectional view taken along a direction A-A' in FIG. 1C parallel to an upper surface of a substrate. As shown in FIG. 2, a block shows each node contact hole 301.

Figure 1D:
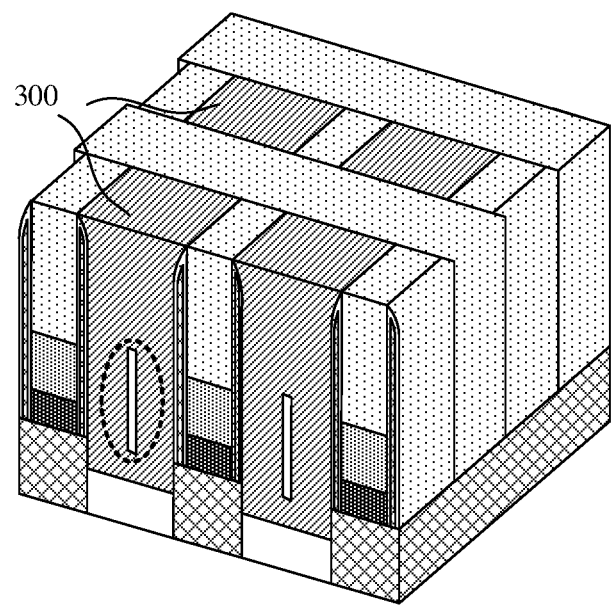
FIG. 1D is a fourth schematic diagram of a process for manufacturing a node contact structure in the related art.

(4) Polysilicon (Poly) is filled. As shown in FIG. 1D, lateral etching is performed along the node contact hole 301 towards the active area 110, deepening is performed towards the shallow trench isolation structure 120, and then Poly is filled in the node contact hole 301, so as to form a node contact structure 300.

Figure 3A:
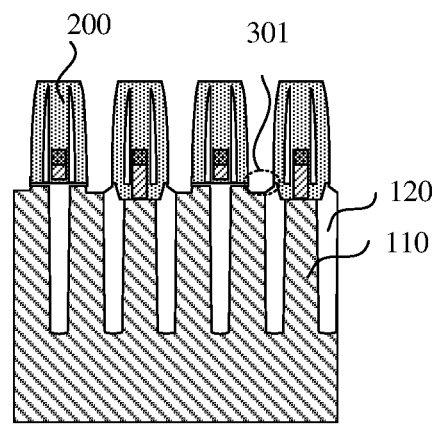
FIG. 3A is a first schematic diagram of a process for filling polysilicon in the related art.
Figure 3B:
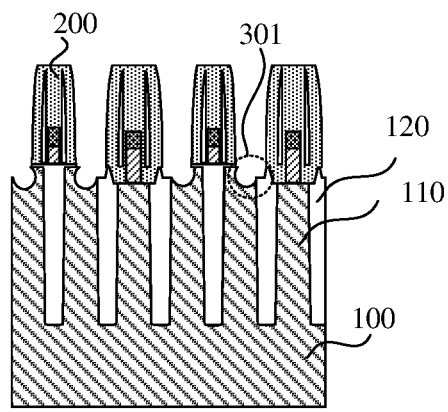
FIG. 3B is a second schematic diagram of a process for filling polysilicon in the related art.
Figure 3C:
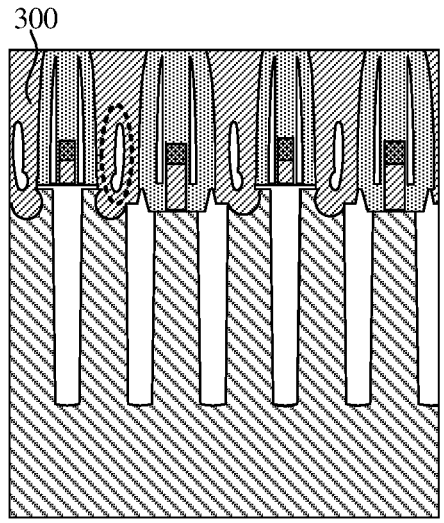
FIG. 3C is a third schematic diagram of a process for filling polysilicon in the related art.

Specifically, in a process from FIG. 1C to FIG. 1D, with reference to FIG. 3A to FIG. 3C, FIG. 3A to FIG. 3C illustrate schematic diagrams of a process for filling polysilicon in the related art. Particularly, FIG. 3A is a sectional view taken along a direction B-B' in FIG. 1 perpendicular to an upper surface of a substrate. As shown in FIG. 3A, after the node contact hole 301 (as shown in a dotted circle in FIG. 3A) is preliminarily obtained, a portion of the active area 110 and a portion of the shallow trench isolation structure 120 need to be continuously etched downwards, so as to obtain a deepened node contact hole 301 (as shown in a dotted circle in FIG. 3B). Then, the polysilicon is filled in the node contact hole 301 shown in FIG. 3B, so as to obtain a node contact structure 300, which is specifically shown in FIG. 3C. Herein, the structure shown in FIG. 3C and the structure shown in FIG. 1D are the same structure.

As shown in FIG. 3C or FIG. 1D, after the node contact hole 301 is manufactured, the node contact hole 301 needs to be further laterally etched and deepened, so that the overall hole accommodating the polysilicon is narrow and long. Therefore, gaps are easily generated during filling the polysilicon, as shown in a dotted circle in FIG. 3C, which affects the electric properties of the semiconductor.

Based on this, the embodiments of the disclosure provide a method for manufacturing a semiconductor structure. The method includes the following operations. A substrate is provided, in which the substrate includes a plurality of active areas. A plurality of bit line contact mask structures are formed above the plurality of active areas, in which each of the plurality of bit line contact mask structures at least covers one active area terminal. Downward etching is performed along the plurality of bit line contact mask structures to form a node contact hole in the active area terminal, and the node contact hole is filled with a semiconductor material to form a first node contact structure. A plurality of bit line structures are formed above the plurality of active areas, and gaps between the plurality of bit line structures are continuously filled with the semiconductor material until a second node contact structure is formed, in which the first node contact structure and the second node contact structure collectively form a node contact structure. In this way, the node contact hole is formed in advance after the bit line contact mask structure is formed, and the node contact hole is filled to form the first node contact structure, so that the node contact hole does not need to be laterally etched and deepened subsequently, which can improve the problem that the filling gaps are easily generated in the node contact structure, thereby improving the electrical properties of the semiconductor.

Each embodiment of the disclosure will be described in detail below with reference to the accompanying drawings.

Figure 4:
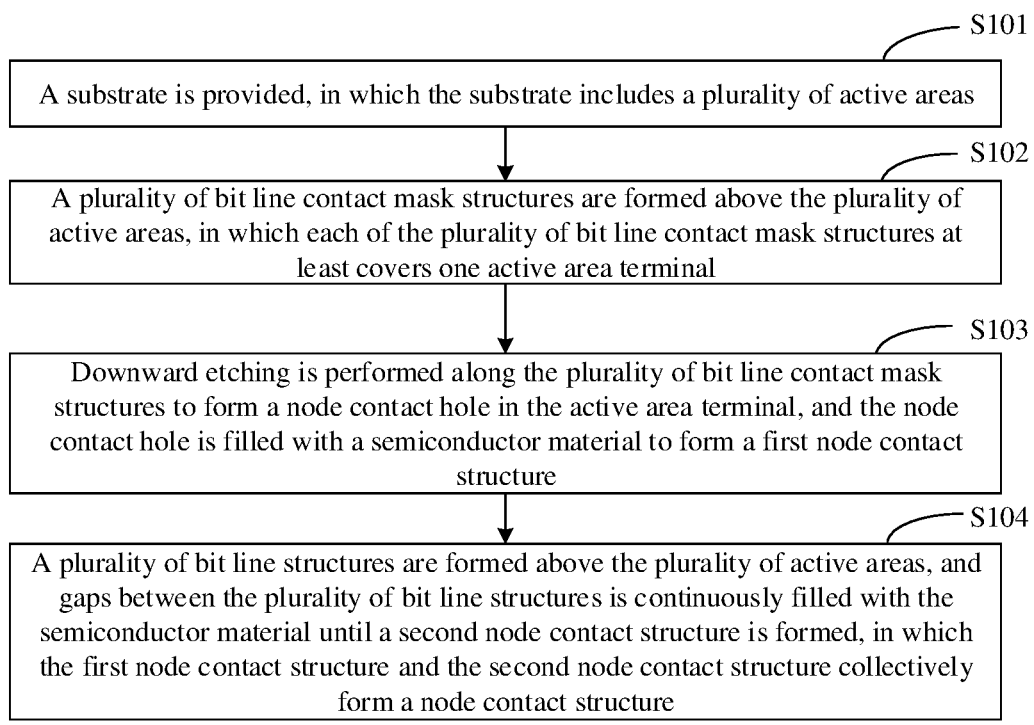
FIG. 4 is a flowchart of a method for manufacturing a semiconductor structure according to an embodiment of the disclosure.

In an embodiment of the disclosure, with reference to FIG. 4, FIG. 4 illustrates a flowchart of a method for manufacturing a semiconductor structure according to an embodiment of the disclosure. As shown in FIG. 4, the method may include the following operations.

In S101: a substrate is provided, in which the substrate includes a plurality of active areas.

In S102: a plurality of bit line contact mask structures are formed above the plurality of active areas, in which each of the plurality of bit line contact mask structures at least covers one active area terminal.

It should be noted that the embodiments of the disclosure provide a method for manufacturing a semiconductor structure, in particular a method for manufacturing an NC structure. The semiconductor structure may be applied to a semiconductor memory, such as a DRAM, a SRAM, an NAND, etc.

For a substrate including a plurality of active areas, a plurality of bit line contact mask structures are formed. Each bit line contact mask structure at least covers one active area terminal. Herein, the bit line contact mask structure is subsequently used for forming a bit line structure.

In some embodiments, the bit line contact mask structure may be a cylinder.

In some embodiments, the operation that the plurality of bit line contact mask structures are formed above the plurality of active areas may include the following operations.

A functional structure layer, a mask layer, and a pattern layer are sequentially formed above the plurality of active areas, the functional structure layer, the mask layer, and the pattern layer being stacked on one another.

A plurality of preset patterns are formed in the pattern layer, in which the pattern layer is divided into a plurality of pillared structures by the plurality of preset patterns.

The plurality of preset patterns are transferred to the functional structure layer through the mask layer, and the pattern layer and the mask layer are removed, so as to obtain the plurality of bit line contact mask structures in the form of pillared structures.

It should be noted that a functional structure layer, a mask layer, and a pattern layer are sequentially formed above the plurality of active areas, the functional structure layer, the mask layer, and the pattern layer being stacked on one another; then, a plurality of preset patterns are formed in the pattern layer, and after that, the plurality of preset patterns are transferred to the functional structure layer through the mask layer; finally, the pattern layer and the mask layer are removed, so that a plurality of bit line contact mask structures can be obtained. Herein, methods for forming the functional structure layer, the mask layer, and the pattern layer may refer to the related art, which will not be repeated in the embodiments of the disclosure.

In some embodiments, the pattern layer may include a photoresist layer.

In some embodiments, the mask layer may include a silicon oxynitride layer and a spin on hardmask layer.

In some embodiments, the functional structure layer may include a dielectric layer, a conductive layer, and a barrier layer.

In some embodiments, the dielectric layer may include silicon oxide ($SiO_2$). The conductive layer may include polysilicon (Poly). The barrier layer may include silicon nitride (SiN).

In a specific embodiment, with reference to FIG. 5A to FIG. 5K, FIG. 5A to FIG. 5K illustrate a schematic diagram of a process for manufacturing a first node contact structure according to an embodiment of the disclosure. Specifically, the manufacture of the first node contact structure may be divided into several stages as follows. (1) A bit line contact mask structure is manufactured. (2) A node contact hole is manufactured (referring to subsequent description). (3) A first node contact structure is filled (referring to subsequent description).

Figure 5A:
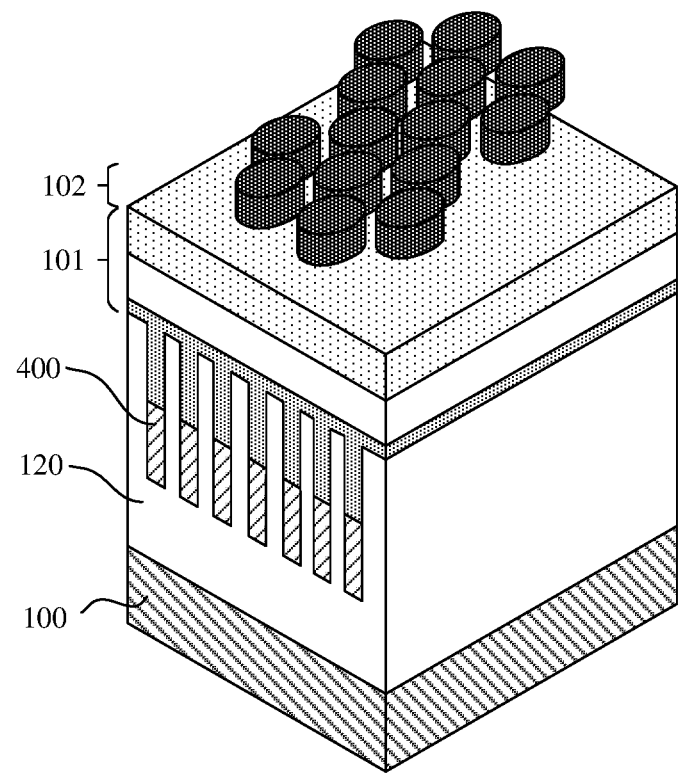
FIG. 5A is a first schematic diagram of a process for manufacturing a first node contact structure according to an embodiments of the disclosure.
Figure 5B:
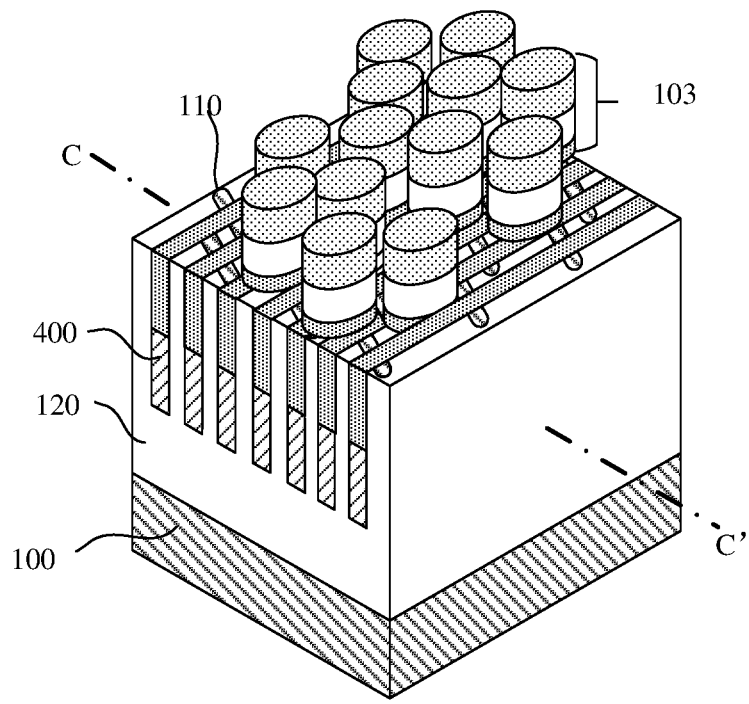
FIG. 5B is a second schematic diagram of a process for manufacturing a first node contact structure according to an embodiments of the disclosure.
Figure 5C:
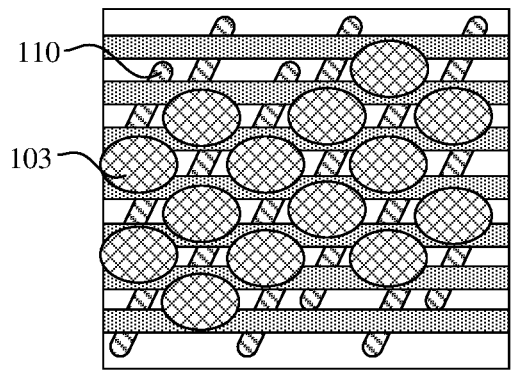
FIG. 5C is a third schematic diagram of a process for manufacturing a first node contact structure according to an embodiments of the disclosure.

According to FIG. 5A to FIG. 5C, the process for manufacturing the bit line contact mask structures includes the following operations.

(1) A substrate 100 is provided, in which the substrate 100 includes a plurality of active areas 110 and a shallow trench isolation structures 120 configured to isolate the plurality of active areas from each other. A functional structure layer 101, a mask layer 102, and a pattern layer (not shown in the figures) are sequentially provided above the plurality of active areas 110. Particularly, the semiconductor structure further includes a manufactured word line structure 400. Since the word line structure 400 has nothing to do with the manufacturing process provided by the embodiments of the disclosure, only the position of the word line structure is illustrated, without detailed description.

(2) A plurality of preset patterns are formed in the pattern layer, and the plurality of preset patterns are transferred downwards to the mask layer 102. As shown in FIG. 5A, the preset patterns transferred from the pattern layer has been present in the mask layer 102. Specifically, the mask layer 102 has been etched into a plurality of mask pillars.

(3) The functional structure layer 101 is etched downwards by using the mask pillars as masks, and then the mask layer 102 is removed, so as to obtain a plurality of bit line contact mask structures 103 in the functional structure layer 101, specifically as shown in FIG. 5B and FIG. 5C. Herein, FIG. 5C is a sectional view taken along a direction C-C' in FIG. 5B parallel to an upper surface of a substrate. As shown in FIG. 5C, each bit line contact mask structure 103 covers one to two active area terminals (i.e., the terminals of the active area 110). Herein, the functional structure layer 101 includes, sequentially from bottom to top, a barrier layer, a conductive layer, and a barrier dielectric layer.

It should be noted that, in some embodiments, the plurality of preset patterns include a first graphic array and a second graphic array. The first graphic array includes a plurality of elliptical shapes, and the second graphic array includes a plurality of elliptical shapes. The plurality of elliptical shapes in the first graphic array intersect with the plurality of elliptical shapes in the second graphic array.

As shown in FIG. 5C, all odd rows of bit line contact mask structures 103 are manufactured from the first graphic array, and all even rows of bit line contact mask structures 103 are manufactured from the second graphic array. As shown in FIG. 5C, the odd rows of bit line contact mask structures 103 intersect with the even rows of bit line contact mask structures 103.

In addition, the cross-section of the bit line contact mask structure 103 may also be in other shapes, such as circular shape.

In this way, the plurality of bit line contact mask structures 103 arranged above the plurality of active areas 110 are obtained through the above operations.

In S103: downward etching is performed along the plurality of bit line contact mask structures to form a node contact hole in the active area terminal, and the node contact hole is filled with a semiconductor material to form a first node contact structure.

It should be noted that downward etching being performed along the plurality of bit line contact mask structures means that: the bit line contact mask structures and the active area terminals covered by the bit line contact mask structures are etched, so as to form the node contact hole (i.e. NC hole) in the active area terminal, and then the node contact hole is filled with the semiconductor material to form the first node contact structure. In this case, the node contact hole is arranged at a bottom position, so that the gaps are not easily generated when the semiconductor material is filled.

In some embodiments, the semiconductor material is polysilicon (Poly).

In a specific embodiment, the operation that downward etching is performed along the plurality of bit line contact mask structures to form the node contact hole in the active area terminal may include the following operations.

A filling layer is formed above the plurality of active areas, in which the plurality of bit line contact mask structures are surrounded by the filling layer.

The plurality of bit line contact mask structures are etched to form a plurality of pillared holes in the filling layer.

The active area terminal covered by a respective one of the plurality of bit line contact mask structures is continuously etched along a respective one of the plurality of pillared holes, so as to form the node contact hole in the active area terminal.

It should be noted that after the plurality of bit line contact mask structures are formed above the plurality of active areas, a filling layer is formed around the bit line contact mask structures, and then the bit line contact mask structures are etched to obtain the filling layer provided with a plurality of pillared holes. The active area terminal covered by a respective one of the plurality of bit line contact mask structures is continuously etched along a respective one of the plurality of pillared holes. In this case, the etched active area terminal forms the node contact hole.

Figure 5D:
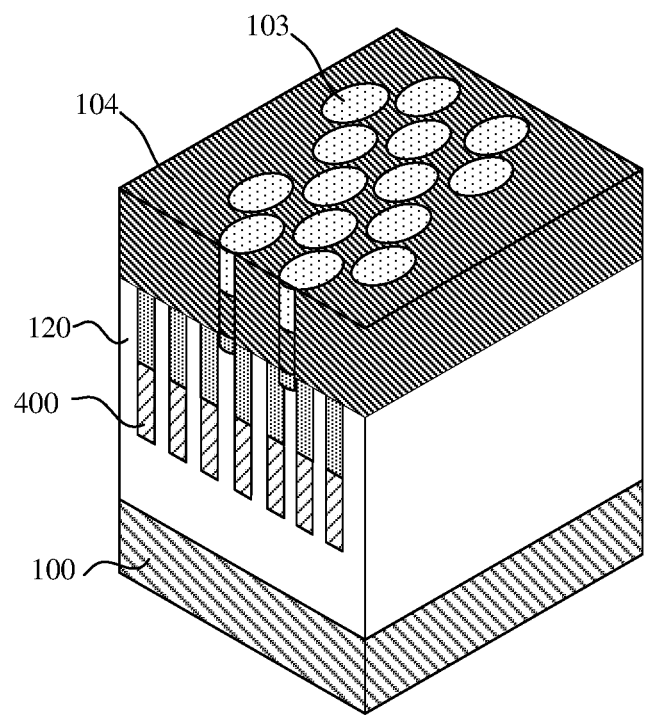
FIG. 5D is a fourth schematic diagram of a process for manufacturing a first node contact structure according to an embodiments of the disclosure.
Figure 5E:
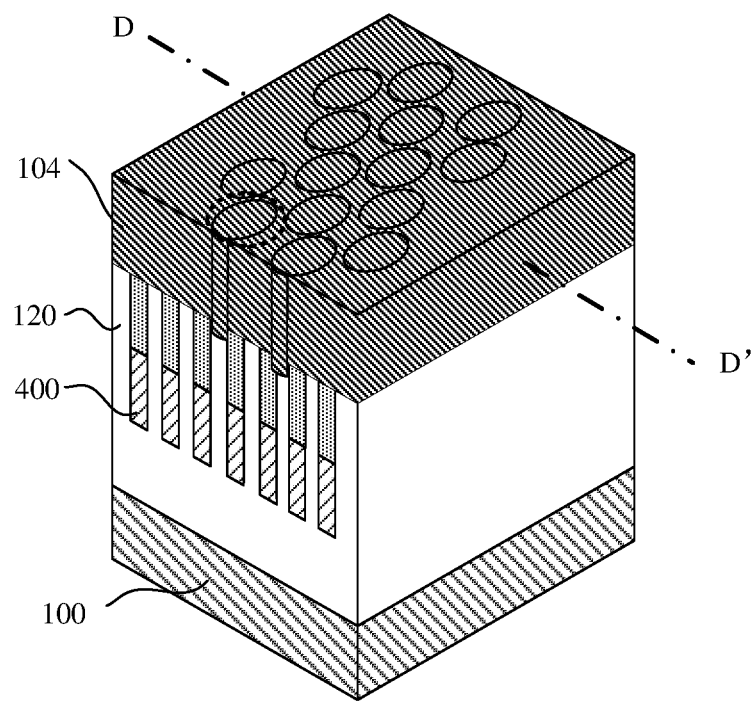
FIG. 5E is a fifth schematic diagram of a process for manufacturing a first node contact structure according to an embodiments of the disclosure.
Figure 5F:
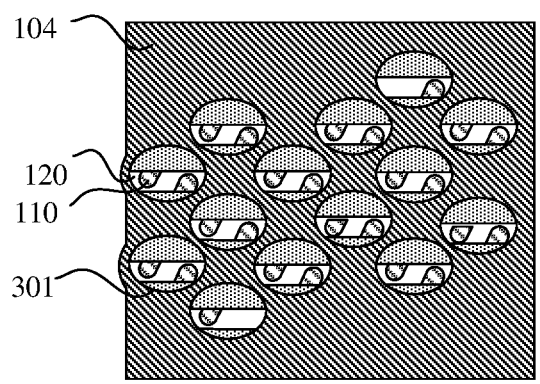
FIG. 5F is a sixth schematic diagram of a process for manufacturing a first node contact structure according to an embodiments of the disclosure.

In a specific embodiment, with reference to FIG. 5D to FIG. 5F, a process for manufacturing the node contact hole includes the following operations.

(1) A filling layer 104 is formed around the plurality of bit line contact mask structures 103, in which a top portion of the filling layer is flush with the plurality of bit line contact mask structures 103 as much as possible, specifically as shown in FIG. 5D.

(2) The plurality of bit line contact mask structures 103 are removed, so as to form a plurality of pillared holes at the original positions of the plurality of bit line contact mask structures. The plurality of pillared holes are continuously deepened until the node contact hole 301 is formed in the active area terminal (i.e., the terminal of the active area 110), specifically as shown in FIG. 5E and FIG. 5F. Herein, the dotted circle in FIG. 5E indicates a pillared hole, and the pillared hole is in communication with the node contact hole 301.

Herein, FIG. 5F is a sectional view taken along a direction D-D' in FIG. 5E parallel to an upper surface of a substrate. In FIG. 5F, a portion of the active area terminal in each node contact hole 301 is etched downwards to form the node contact hole 301. In this way, the node contact hole is manufactured prior to the formation of the bit line structure, so that a portion of Poly is firstly filled, without the operation of deepening the node contact hole, thereby avoiding the gaps from being generated in the overall filling process.

Figure 5G:
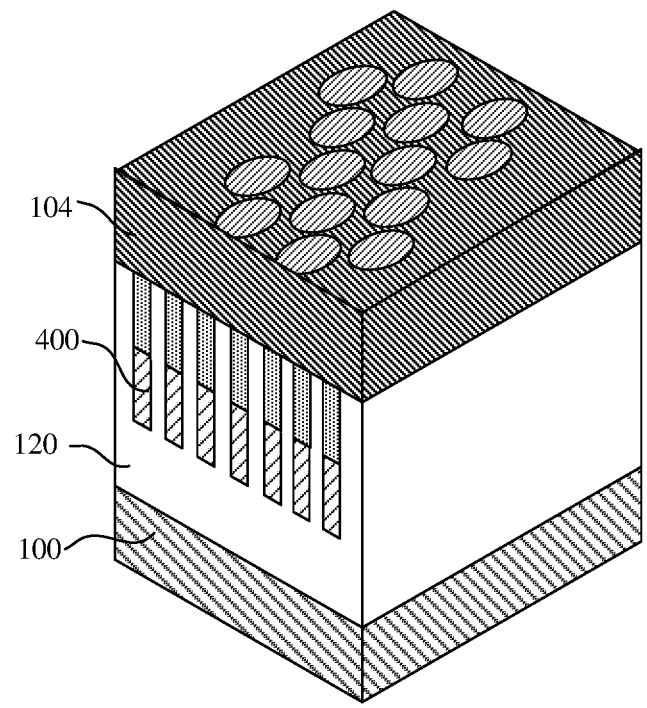
FIG. 5G is a seventh schematic diagram of a process for manufacturing a first node contact structure according to an embodiments of the disclosure.
Figure 5H:
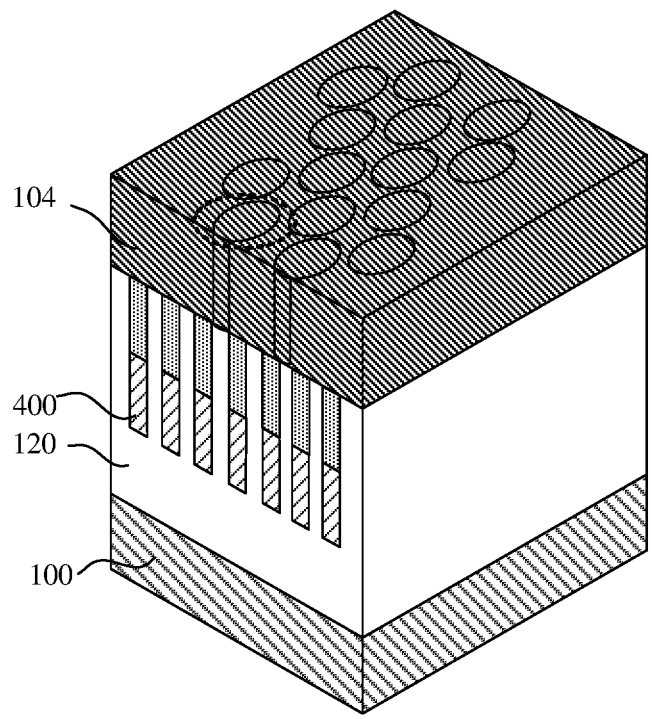
FIG. 5H is an eighth schematic diagram of a process for manufacturing a first node contact structure according to an embodiments of the disclosure.

In another specific embodiment, with reference to FIG. 5G and FIG. 5H, a process for filling the first node contact structure includes the following operations.

(1) After the node contact hole 301 is obtained, the semiconductor material (Poly) is filled in the plurality of pillared holes in FIG. 5E, until the plurality of pillared holes are closed by the Poly, specifically as shown in FIG. 5G.

(2) The Poly in the plurality of pillared holes is etched, and only the Poly in the node contact hole 301 is retained. In this case, the Poly in the node contact hole forms the first node contact structure 302. In addition, a plurality of pillared holes are formed in the filling layer 104 again, which is specifically shown as a dotted circle in FIG. 5H.

Particularly, when the Poly is filled in the pillared hole, the node contact hole 301 is arranged at the bottommost portion of the pillared hole, so that gaps may be generated in the middle section of the pillared hole. However, the polysilicon in the pillared hole is to be completely etched, thus, in this process, the gaps will not affect the performance of the semiconductor.

In this way, after the bit line contact mask structure is manufactured, and before the bit line structure is manufactured, the node contact hole is formed at the active area terminal, and the semiconductor material is filled, so as to form the first node contact structure.

In S104: a plurality of bit line structures are formed above the plurality of active areas, and gaps between the plurality of bit line structures is continuously filled with the semiconductor material until a second node contact structure is formed, in which the first node contact structure and the second node contact structure collectively form a node contact structure.

It should be noted that, after the first node contact structure is formed, a plurality of bit line structures are continuously formed above the plurality of active areas, and a second node contact structure is continuously formed in the gaps between the plurality of bit line structures, so as to obtain a complete node contact structure. Herein, a specific process for forming the bit line structure may refer to the related art, which will not be repeated in the disclosure.

As mentioned above, in the related art, it is necessary to form the NC hole after the bit line structure is manufactured, and the NC hole is filled with the Poly to form the NC structure. However, gaps are easily generated in the process of filling the Poly, which affects the electrical properties. In the embodiments of the disclosure, the NC hole is formed after the bit line contact mask structure is manufactured and before the bit line structure is manufactured, so that the NC hole can be manufactured in advance, and meanwhile, the polysilicon may be filled in advance to form the first node contact structure. On the one hand, the node contact structure is manufactured in two stages, and the polysilicon is filled in two stages. The depth of the hole filled by the polysilicon is small each time, which avoids the generation of the filling gaps, thereby improving the electrical properties. On the other hand, by manufacturing the NC hole in advance, the operation of deepening the NC hole (this operation is caused by firstly forming the bit line structure, and then forming the NC hole) is omitted, so as to further avoid the generation of the filling gaps, thereby improving the electrical properties.

In some embodiments, the operation that the plurality of bit line structures are formed above the plurality of active areas may include the following operations.

The plurality of pillared holes are filled with a mask material until the plurality of pillared holes are closed by the mask material.

The filling layer is removed to obtain a plurality of new bit line contact mask structures.

The plurality of bit line structures are formed above the plurality of active areas based on the plurality of new bit line contact mask structures.

It should be noted that the pillared holes in the filling layer are closed by using the mask material, and then the filling layer is removed, so that the new bit line contact mask structures are obtained again, thereby facilitating subsequent formation of the plurality of bit line structures above the plurality of the active areas.

Figure 5I:
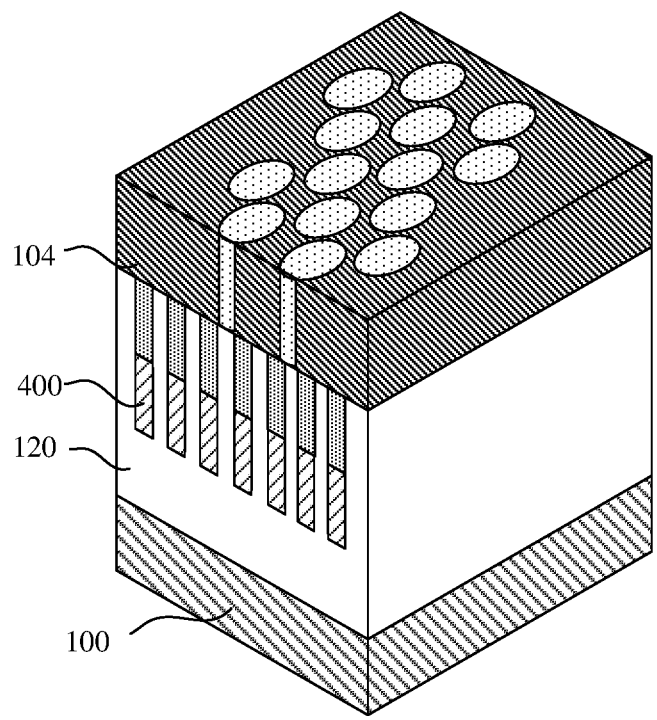
FIG. 5I is a ninth schematic diagram of a process for manufacturing a first node contact structure according to an embodiments of the disclosure.
Figure 5J:
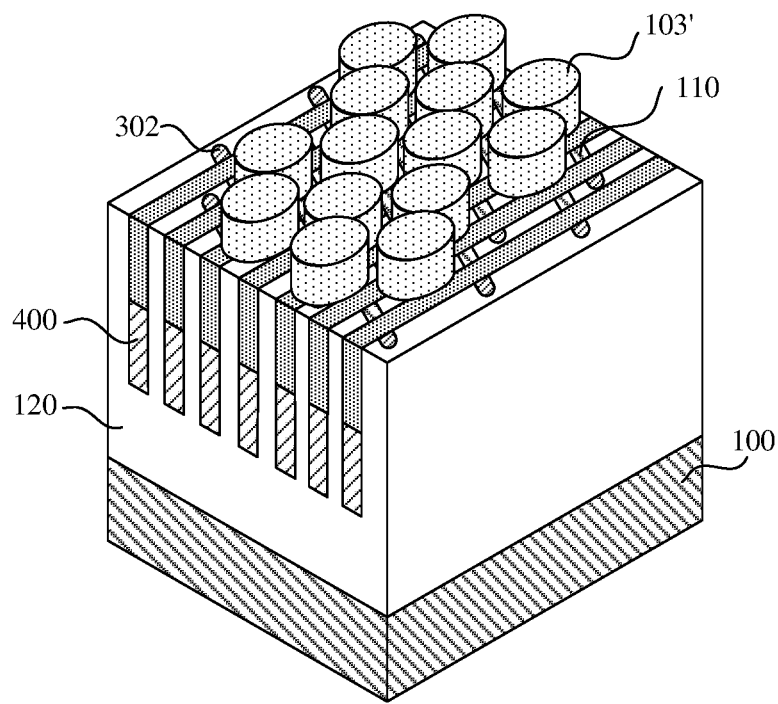
FIG. 5J is a tenth schematic diagram of a process for manufacturing a first node contact structure according to an embodiments of the disclosure.
Figure 5K:
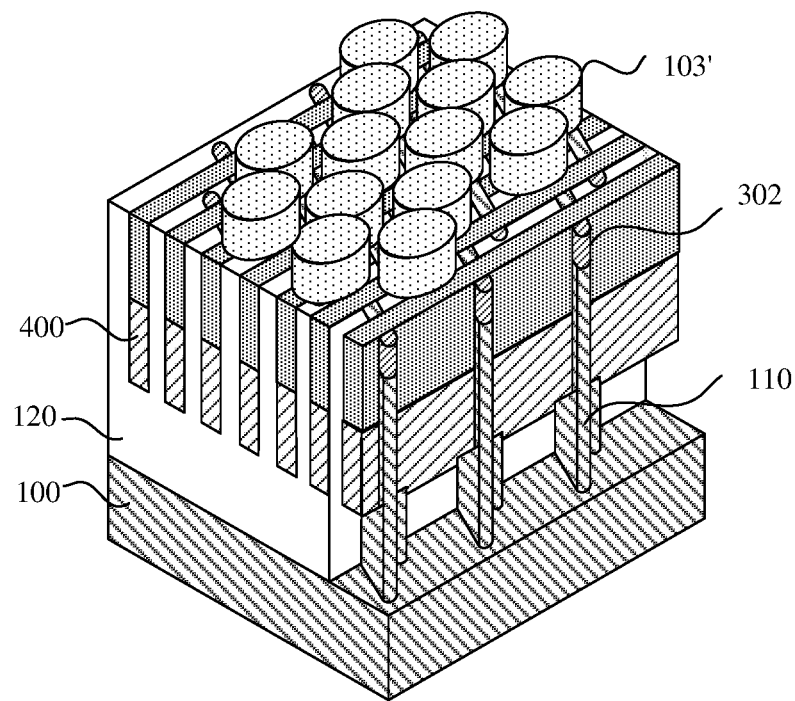
FIG. 5K is an eleventh schematic diagram of a process for manufacturing a first node contact structure according to an embodiments of the disclosure.

In a specific embodiment, with reference to FIG. 5I to FIG. 5K, a process for manufacturing the plurality of new bit line contact mask structures includes the following operations.

(1) For the plurality of pillared holes in FIG. 5H, the mask material is continuously filled in the plurality of pillared holes, until the plurality of pillared holes are closed by the mask material, specifically as shown in FIG. 5I.

(2) The filling layer 104 is etched. In this case, a plurality of pillared structures formed by the mask material, i.e., a plurality of new bit line contact mask structures 103', are obtained, specifically as shown in FIG. 5J and FIG. 5K.

Particularly, in FIG. 5K, a portion of the shallow trench isolation structure 120 in FIG. 5J is not drawn, so as to better show the new bit line contact mask structure 103' and the first node contact structure 302. Herein, the new bit line contact mask structure 103' shown in FIG. 5J and FIG. 5K and the bit line contact mask structure 103 shown in FIG. 5B have the same position and function. However, in FIG. 5K, the first node contact structure 302 has been formed at the active area terminal. In this way, a second node contact structure 303 may be continuously formed on the basis of the first node contact structure 302 subsequently, so as to form a complete node contact structure 300.

That is to say, in the related art, after the bit line contact mask structure is formed, the bit line structure will be continuously formed, and the active area terminal is etched back downwards to form the node contact hole. Moreover, the active area and the shallow trench isolation structure need to be further etched back to deepen the node contact hole, so that the gaps are easily generated when the polysilicon is filled, thereby affecting the electrical properties of the semiconductor. In the embodiments of the disclosure, the node contact hole is manufactured in advance, and a portion of the Poly is filled in advance, so that the active area terminal does not need to be etched back after the bit line structure is formed, thereby avoiding the generation of the gaps during filling.

In some embodiments, a covering layer, which is continuous, is provided on surfaces of the plurality of bit line structures. The operation that the gaps between the plurality of bit line structures are continuously filled with the semiconductor material may include the following operations.

The covering layer at bottom portions of the gaps between the plurality of bit line structures is etched to expose a surface of the first node contact structure.

The gaps between the plurality of bit line structures is continuously filled with the semiconductor material, in which the semiconductor material in the gaps between the plurality of bit line structures forms the second node contact structure.

Figure 6A:
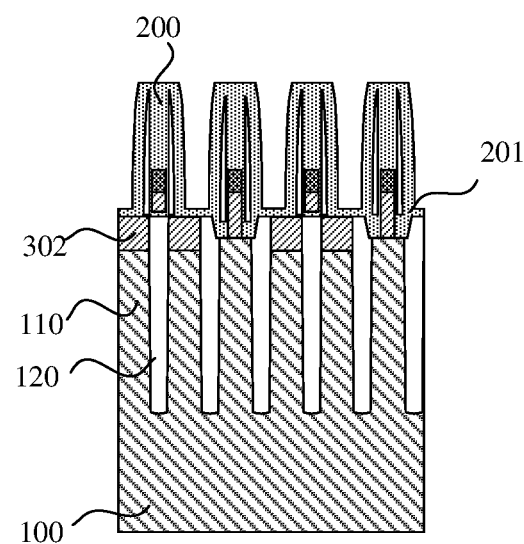
FIG. 6A is a first schematic diagram of a process for manufacturing a second node contact structure according to an embodiment of the disclosure.
Figure 6B:
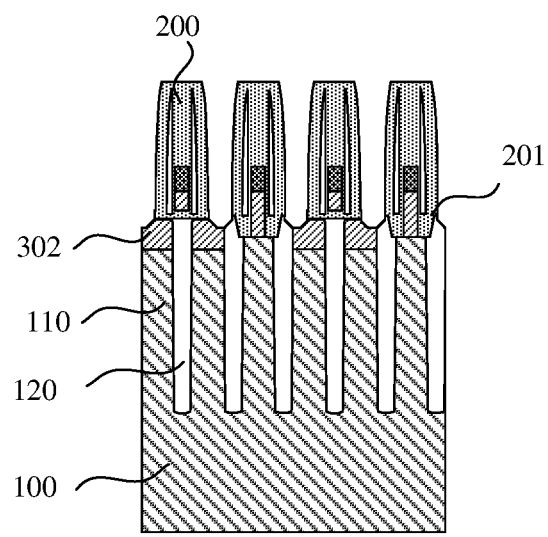
FIG. 6B is a second schematic diagram of a process for manufacturing a second node contact structure according to an embodiment of the disclosure.
Figure 6C:
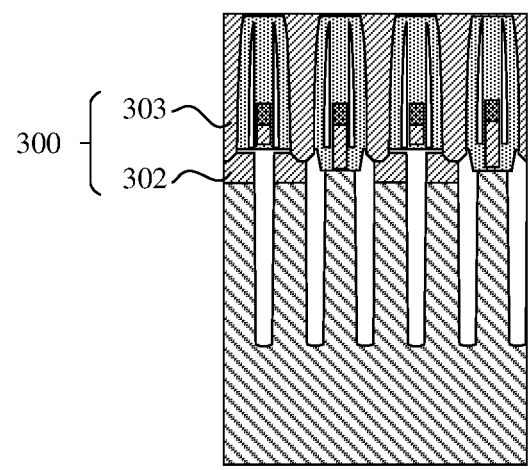
FIG. 6C is a third schematic diagram of a process for manufacturing a second node contact structure according to an embodiment of the disclosure.

It should be noted that, with reference to FIG. 6A to FIG. 6C, FIG. 6A to FIG. 6C illustrate schematic diagrams of a process for manufacturing a second node contact structure according to an embodiment of the disclosure.

As shown in FIG. 6A, a plurality of bit line structures 200 are formed above the plurality of active areas. A covering layer 201, which is continuous, is provided on the surfaces of the plurality of bit line structures 200. The first node contact structure 302 is completely covered by the covering layer 201 and is not exposed. Therefore, with reference to FIG. 6B, a portion of the covering layer 201 at the bottom portions of the gaps between different bit line structures 200 needs to be etched to expose the first node contact structure 302. Finally, with reference to FIG. 6C, in this case, the gaps between the plurality of bit line structures 200 are filled with polysilicon, so as to form the second node contact structure 303 above the first node contact structure 302. The first node contact structure 302 is in contact with the second node contact structure 303, so as to form a complete node contact structure 300. Herein, as shown in FIG. 6C, an edge line is drawn at the contact position between the first node contact structure 302 and the second node contact structure 303. The edge line here is only for better showing the first node contact structure and the second node contact structure, which does not mean that the edge line actually exists.

In this way, compared with the related art, in the NC manufacturing method provided by the embodiments of the disclosure, the NC hole may be manufactured in advance, and the NC hole is not deepened, which avoids the disadvantage that air bubbles are remained subsequently due to insufficient filling of the holes at the side walls.

In some embodiments, a shallow trench isolation structure is provided between the plurality of active areas. The method may further include the following operation.

During etching the covering layer at the bottom portions of the gaps between the plurality of bit line structures, a portion of the shallow trench isolation structure and a portion of the first node contact structure are etched, so as to increase a contact area between the second node contact structure and the first node contact structure.

Particularly, in order to increase the contact area between the second node contact structure and the first node contact structure, with reference to FIG. 6B, during etching the covering layer 201 at the bottom portions of the gaps between the plurality of bit line structures 200, a portion of the shallow trench isolation structure 120 and a portion of the first node contact structure 302 are etched.

In some embodiments, the semiconductor material may include polysilicon (Poly), the mask material may include silicon oxynitride (SiON), and a material of the filling layer may include silicon oxide ($SiO_2$).

In conclusion, in the embodiments of the disclosure, after the bit line contact mask structure is formed, the node contact hole may be manufactured by using the bit line contact mask structure, and the Poly is filled for the first time to obtain the first node contact structure. Then, the bit line contact mask structure is reformed, then the bit line structure is formed, and the second node contact structure is continuously formed between the bit line structures. In this way, the Poly may be filled in two stages by manufacturing the node contact hole in advance, without the operation of deepening the node contact hole, which can avoid the generation of the gaps during filling the Poly, thereby improving the electrical properties.

The embodiments of the disclosure provide a method for manufacturing a shallow trench isolation structure, which includes the following operations. A substrate is provided, in which the substrate includes a plurality of active areas. A plurality of bit line contact mask structures are formed above the plurality of active areas, in which each of the plurality of bit line contact mask structures at least covers one active area terminal. Downward etching is performed along the plurality of bit line contact mask structures to form a node contact hole in the active area terminal, and the node contact hole is filled with a semiconductor material to form a first node contact structure. A plurality of bit line structures are formed above the plurality of active areas, and gaps between the plurality of bit line structures are continuously filled with the semiconductor material until a second node contact structure is formed, in which the first node contact structure and the second node contact structure collectively form a node contact structure. In this way, the node contact hole is formed in advance after the bit line contact mask structure is formed, and the node contact hole is filled, so that the node contact hole does not need to be laterally etched and deepened subsequently, which can improve the problem that the filling gaps are easily generated in the node contact structure, thereby improving the electrical properties of the semiconductor.

In another embodiment of the disclosure, with reference to FIG. 7A to FIG. 14B, FIG. 7A to FIG. 14B illustrate schematic diagrams of a process for manufacturing a bit line contact mask structure 103 according to an embodiment of the disclosure. In FIG. 7A to FIG. 14B, the front views all refer to the sectional views taken along a direction X-X' in the top view, and the side views all refer to the sectional views taken along a direction Y-Y' in the top view.

In the embodiments of the disclosure, a substrate 100 is provided. The substrate 100 includes a plurality of active areas 110 and a shallow trench isolation structure 120 arranged between different active areas 110. A functional structure layer 101, a first mask layer 1021, a second mask layer 1022, and a third mask layer 1023 are sequentially stacked above the plurality of active areas 110.

The functional structure layer 101 includes, sequentially from bottom to top, a SiN layer (i.e., a barrier layer), a Poly layer (i.e., a conductive layer), and an Oxide layer (i.e., a dielectric layer). The first mask layer 1021 includes, sequentially from bottom to top, a SOH layer and a SiON layer. The second mask layer 1022 includes, sequentially from bottom to top, a SOH layer and a SiON layer. The third mask layer 1023 includes, sequentially from bottom to top, an Oxide layer, a SOH layer, a SiON layer, and a PR layer.

In a first stage, a plurality of BLC mask structures are manufactured.

Figure 7A:
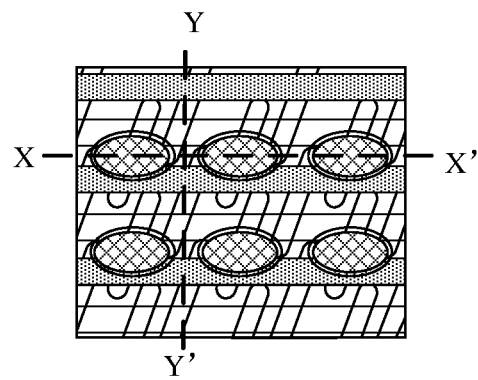
FIG. 7A is a first schematic diagram of a process for manufacturing a bit line contact mask structure according to an embodiment of the disclosure.
Figure 7B:
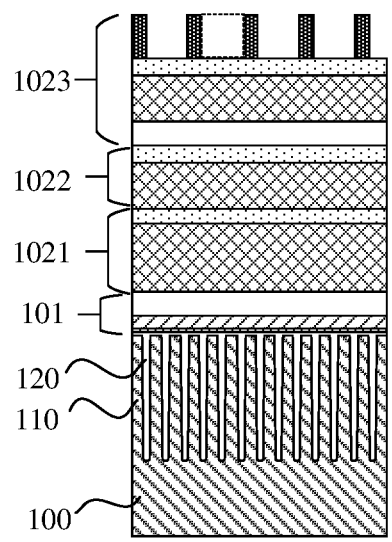
FIG. 7B is a second schematic diagram of a process for manufacturing a bit line contact mask structure according to an embodiment of the disclosure.
Figure 7C:
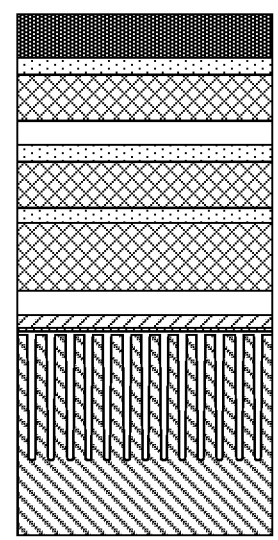
FIG. 7C is a third schematic diagram of a process for manufacturing a bit line contact mask structure according to an embodiment of the disclosure.

In a first operation, a plurality of BLC1 patterns are manufactured. With reference to FIG. 7A to FIG. 7C, for the third mask layer 1023, a plurality of circular patterns (corresponding to the first graphic array described above) are formed on the PR layer by using a circular mask. These circular patterns are etched to form a plurality of pillared holes in the PR layer (as shown in the dotted block in FIG. 7A), so as to form the plurality of BLC1 patterns. Particularly, FIG. 7A is a top view of the semiconductor structure after being subjected to the first operation. FIG. 7B is a front view of the semiconductor structure after being subjected to the first operation. FIG. 7C is a side view of the semiconductor structure after being subjected to the first operation.

In a second operation, the plurality of BLC1 patterns are transferred. With reference to FIG. 8A and FIG. 8B, the plurality of BLC1 patterns are transferred downwards to the Oxide layer in the third mask layer 1023, that is, a plurality of pillared holes (as shown in the dotted block in FIG. 8A) are formed in the Oxide layer in the third mask layer 1023. Particularly, FIG. 8A is a front view of the semiconductor structure after being subjected to the second operation. FIG. 8B is a side view of the semiconductor structure after being subjected to the second operation.

In a third operation, a plurality of BLC2 patterns are manufactured. With reference to FIG. 9A, FIG. 9B, and FIG. 9C, a plurality of circular patterns (corresponding to the second graphic array described above) are formed on the PR layer again by using a circular mask. These circular patterns are etched to form some other pillared holes in the PR layer, so as to form the plurality of BLC2 patterns. Herein, the circles in the BLC1 patterns and the circles in the BLC2 patterns are located in staggered positions. Particularly, FIG. 9A is a top view of the semiconductor structure after being subjected to the third operation. FIG. 9B is a front view of the semiconductor structure after being subjected to the third operation. FIG. 9C illustrates a side view of the semiconductor structure after being subjected to the third operation.

Figure 10A:
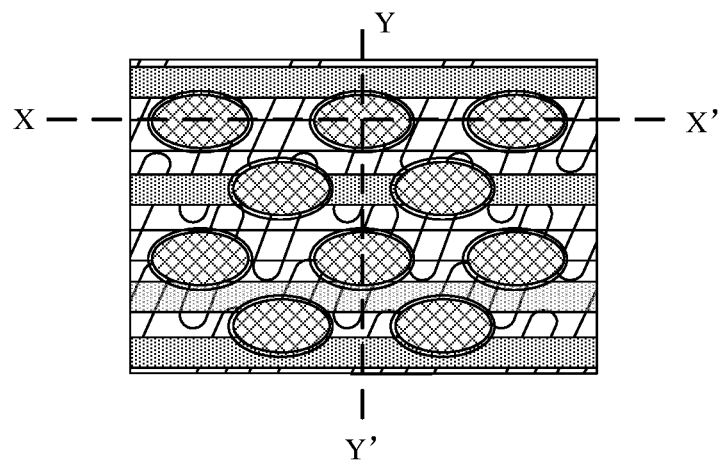
FIG. 10A is a ninth schematic diagram of a process for manufacturing a bit line contact mask structure according to an embodiment of the disclosure.
Figure 10B:
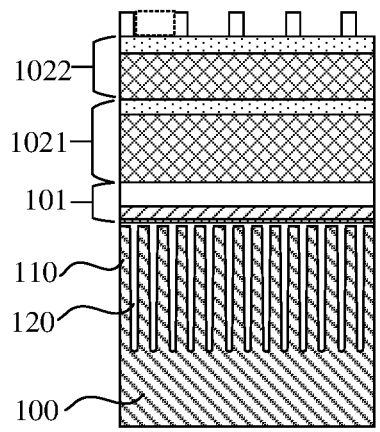
FIG. 10B is a tenth schematic diagram of a process for manufacturing a bit line contact mask structure according to an embodiment of the disclosure.
Figure 10C:
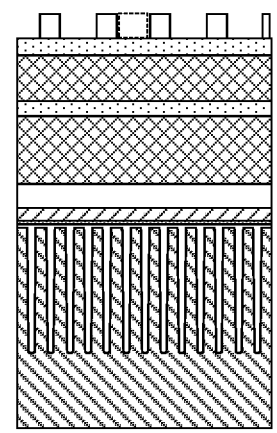
FIG. 10C is an eleventh schematic diagram of a process for manufacturing a bit line contact mask structure according to an embodiment of the disclosure.

In a fourth operation, the plurality of BLC2 patterns are transferred. With reference to FIG. 10A, FIG. 10B, and FIG. 10C, the plurality of BLC2 patterns are transferred to the Oxide layer in the third mask layer 1023, that is, some other pillared holes are formed in the Oxide layer. In this case, in the Oxide layer, the plurality of pillared holes transferred from the BLC1 patterns and the plurality of pillared holes transferred from the BLC2 patterns collectively form the BLC patterns (as shown in the dotted blocks in FIG. 10B and FIG. 10C). Particularly, FIG. 10A is a top view of the semiconductor structure after being subjected to the fourth operation. FIG. 10B is a front view of the semiconductor structure after being subjected to the fourth operation. FIG. 10C is a side view of the semiconductor structure after being subjected to the fourth operation.

Figure 11A:
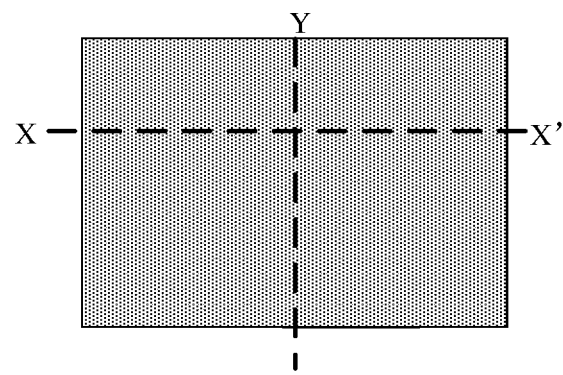
FIG. 11A is a twelfth schematic diagram of a process for manufacturing a bit line contact mask structure according to an embodiment of the disclosure.

In a fifth operation, the plurality of BLC patterns are transferred. With reference to FIG. 11A, FIG. 11B, and FIG. 11C, the plurality of BLC patterns are transferred downwards from the Oxide layer in the third mask layer 1023 to the SiON structure in the second mask layer 1022. In this case, a plurality of pillared holes are formed in the SiON layer, and the plurality of pillared holes penetrate through the SiN layer below the SiON layer. Particularly, FIG. 11A is a top view of the semiconductor structure after being subjected to the fifth operation. FIG. 11B is a front view of the semiconductor structure after being subjected to the fifth operation. FIG. 11C is a side view of the semiconductor structure after being subjected to the fifth operation.

Figure 12B:
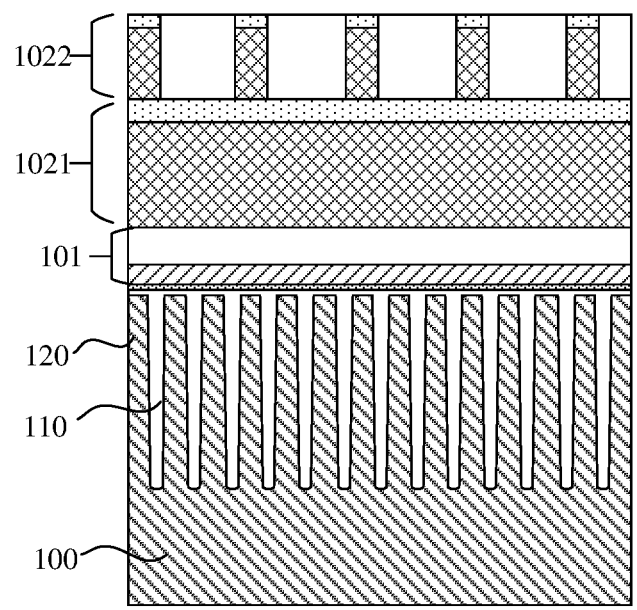
FIG. 12B is a sixteenth schematic diagram of a process for manufacturing a bit line contact mask structure according to an embodiment of the disclosure.

In a sixth operation, the first manufacture of a plurality of reverse patterns is performed. As shown in FIG. 12A and FIG. 12B, the pillared holes in the second mask layer 1022 are filled with $SiO_2$. Particularly, FIG. 12A is a top view of the semiconductor structure after being subjected to the sixth operation. FIG. 12B is a front view of the semiconductor structure after being subjected to the sixth operation. In addition, it may also be selected that the pillared holes are filled with photoresist.

Figure 13A:
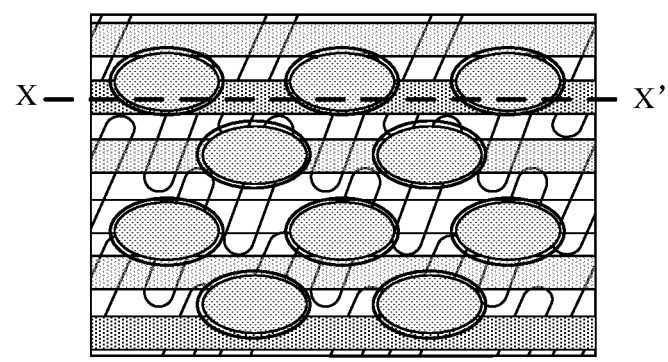
FIG. 13A is a seventeenth schematic diagram of a process for manufacturing a bit line contact mask structure according to an embodiment of the disclosure.
Figure 13B:
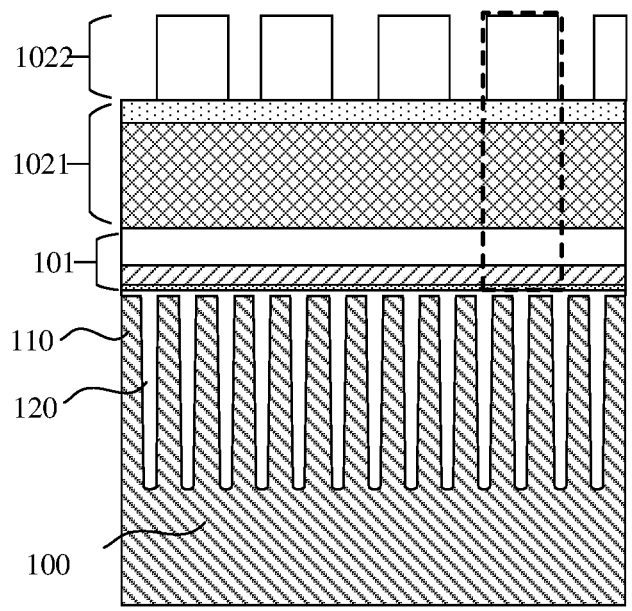
FIG. 13B is an eighteenth schematic diagram of a process for manufacturing a bit line contact mask structure according to an embodiment of the disclosure.

In a seventh operation, the second manufacture of the plurality of reverse patterns is performed. As shown in FIG. 13A and FIG. 13B, the SiON layer and the SiN layer remaining in the second mask layer 1022 are removed to form a plurality of cylinders (corresponding to the pattern layer in the previous embodiment), which may also be referred to as reversely transferring patterns. In other words, a plurality of pillared holes originally located in the SiON layer and the SiN layer are converted into a plurality of cylinders. Particularly, FIG. 13A is a top view of the semiconductor structure after being subjected to the seventh operation. FIG. 13B is a front view of the semiconductor structure after being subjected to the seventh operation.

Figure 14A:
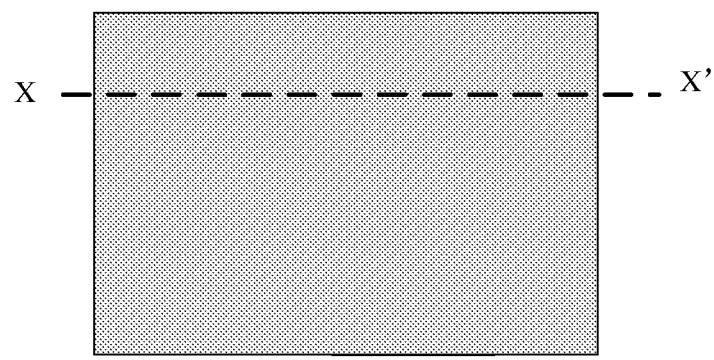
FIG. 14A is a nineteenth schematic diagram of a process for manufacturing a bit line contact mask structure according to an embodiment of the disclosure.
Figure 14B:
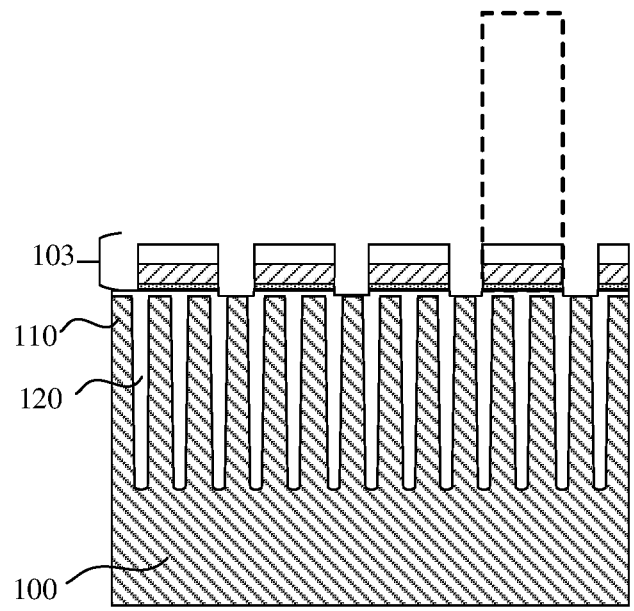
FIG. 14B is a twentieth schematic diagram of a process for manufacturing a bit line contact mask structure according to an embodiment of the disclosure.

In an eighth operation, a plurality of bit line contact structures are formed. As shown in FIG. 14A and FIG. 14B, the functional structure layer 101 (a dotted position in FIG. 13B) is etched downwards along the first mask layer 1021 by using the plurality of cylinders as masks, and then the first mask layer 1021 is removed, so as to obtain a plurality of cylinders formed by the original functional structure layer, that is, the bit line contact mask structures 103. Particularly, FIG. 14A is a top view of the semiconductor structure after being subjected to the eighth operation. FIG. 14B is a front view of the semiconductor structure after being subjected to the eighth operation.

In a second stage, a node contact structure is manufactured.

As shown in FIG. 5B, FIG. 5B illustrates a schematic three-dimensional diagram of the substrate 100 after the BLC mask structures are formed. In other words, in a case that part of details is ignored, FIG. 5B and FIG. 14 (FIG. 14A and FIG. 14B) represent the semiconductor structure in the same state. For FIG. 5B, the first node contact structure is formed by the following operations.

In a first operation, a filling layer is formed. As shown in FIG. 5D, a filling layer 104 is deposited above the plurality of active areas 110. The filling layer may include a silicon dioxide layer, and the plurality of bit line contact mask structures 103 are completely surrounded by the filling layer 104.

In a second operation, a node contact hole is formed. As shown in FIG. 5E and FIG. 5F, the plurality of bit line contact mask structures 103 are etched to form a plurality of pillared holes in the filling layer 104. Downward etching is performed by using the filling layer 104 as a reverse mask until a portion of the active area terminal (i.e., the terminal of the active area 110) is etched. In this way, a plurality of pillared holes are formed in the filling layer 104, and the pillared holes extend into the active areas 110 and the shallow trench isolation structure 120. In other words, the terminal of the active area 110 is partially etched, and the etched terminal of the active area 110 forms the node contact hole 301.

In a third operation, a first node contact structure is formed. As shown in FIG. 5G and FIG. 5H, the plurality of pillared holes in the filling layer 104 are filled with Poly, and then the Poly in the plurality of pillared holes is removed until reaching the SiN layer in the substrate 100 (corresponding to the plane at the top end of the active area 110). In this case, the pillared holes are reformed in the filling layer 104, while the Poly in the node contact hole 301 is retained, so as to form the first node contact structure 302.

In a fourth operation, a plurality of new bit line contact structures 103' are reformed. As shown in FIG. 5I and FIG. 5J, the plurality of pillared holes formed in the filling layer 104 are refilled with SiON to serve as a mask, and then the filling layer 104 is etched. In this case, a plurality of cylinders formed by SiON are obtained again as the new bit line contact structures 103'.

In a fifth operation, a plurality of bit line structures are formed. As shown in FIG. 6A, a plurality of bit line structures 200 are formed by using the new bit line contact structures 103'. The outer sides of the bit line structures 200 include a continuous covering layer 201. Herein, the specific processes for forming the bit line structures 200 and the covering layer 201 may refer to the related art.

In a sixth operation: the first formation of a second node contact structure is performed. As shown in FIG. 6B, for the bottom portions of the gaps between different bit line structures 200, a portion of the covering layer 201, the SiO$_2$ (a portion of the shallow trench isolation structure 120), and the Poly (a portion of the first node contact structure 302) are etched to form holes. The SiO$_2$ and the Poly are further etched to enlarge and deepen the holes, so that the surface exposed by the remaining first node contact structure 302 is increased, and the contact surface between the subsequently filled Poly and the Poly in the first node contact structure 302 is larger.

In a seventh operation: the second formation of the second node contact structure is performed. As shown in FIG. 6C, the gaps between different bit line structures is filled with the Poly to obtain a second node contact structure 303. The second node contact structure 303 and the first node contact structure 302 collectively form a node contact structure 300.

The embodiments of the disclosure provide a method for manufacturing a shallow trench isolation structure. Through further explanation of the embodiments of the disclosure on the above embodiments, it can be seen that, compared with the method for manufacturing the NC by directly filling Poly in the related art, the method for manufacturing the NC provided by the embodiments of the disclosure does not need to further laterally etch the active area (i.e., deepen the node contact hole) after the node contact hole is formed, thereby avoiding the disadvantage of insufficient filling of the holes at the side walls in the subsequent filling process. As shown in FIG. 3C, air bubbles are easily generated at the side walls by the method for manufacturing the NC in the related art. As shown in FIG. 6C, the method for manufacturing the NC in the embodiments of the disclosure does not need to etch the side wall of the bottom portion of the NC, so as to improve the problem of the generation of bubbles, and improve the electrical properties of the node contact structure.

In yet another embodiment in the disclosure, a semiconductor structure is provided. The semiconductor structure is manufactured by the method for manufacturing the semiconductor structure described above.

Since the semiconductor structure is manufactured by the manufacturing method described above, the node contact hole is formed in advance after the bit line contact mask structure is formed, and the node contact hole is filled, so that the node contact hole does not need to be laterally etched and deepened subsequently, which can improve the problem that the filling gaps are easily generated in the node contact structure, thereby improving the electrical properties of the semiconductor.

Figure 15:
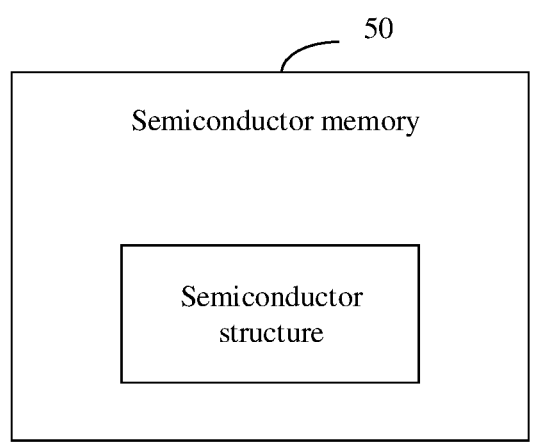
FIG. 15 is a schematic diagram of a semiconductor memory according to an embodiment of the disclosure.

In still another embodiment of the disclosure, with reference to FIG. 15, FIG. 15 illustrates a schematic diagram of a semiconductor memory 50 according to an embodiment of the disclosure. As shown in FIG. 15, the semiconductor memory 50 includes the semiconductor structure described above.

For the semiconductor memory 50, since the semiconductor memory 50 includes the semiconductor structure, and the semiconductor structure is manufactured by the manufacturing method described above, the node contact hole is formed in advance after the bit line contact mask structure is formed, and the node contact hole is filled, so that the node contact hole does not need to be laterally etched and deepened subsequently, which can improve the problem that the filling gaps are easily generated in the node contact structure, thereby improving the electrical properties of the semiconductor.

Embodiments of the disclosure provide a method for manufacturing a semiconductor structure, a semiconductor structure, and a semiconductor memory. The method includes the following operations. A substrate is provided, in which the substrate includes a plurality of active areas. A plurality of bit line contact mask structures are formed above the plurality of active areas, in which each of the plurality of bit line contact mask structure at least covers one active area terminal. Downward etching is performed along the plurality of bit line contact mask structures to form a node contact hole in the active area terminal. The node contact hole is filled with a semiconductor material to form a first node contact structure. A plurality of bit line structures are formed above the plurality of active areas, and gaps between the plurality of bit line structures are continuously filled with the semiconductor material until a second node contact structure is formed, in which the first node contact structure and the second node contact structure collectively form a node contact structure. In this way, the node contact hole is formed in advance after the bit line contact mask structure is formed, and the node contact hole is filled to form the first node contact structure, so that the node contact hole does not need to be laterally etched and deepened subsequently, which can improve the problem that the filling gaps are easily generated in the node contact structure, thereby improving the electrical properties of the semiconductor.

The foregoing descriptions are only the preferred embodiments of the disclosure, and are not intended to limit the protection scope of the disclosure.

It should be noted that in the present disclosure, terms "include", "comprise" or any other variants thereof are intended to cover non-exclusive inclusion, so that a process, a method, an article or a device including a series of elements not only includes those elements, but also includes those that are not explicitly listed, or also include elements inherent to the process, the method, the article, or the device. In the case that there are no more limitations, an element defined by the phrase "including a . . . " does not exclude the existence of other same elements in the process, the method, the article, or the device that includes the element.

The sequence numbers of the above-mentioned embodiments of the disclosure are merely for the description, and do not represent the advantages and disadvantages of the embodiments.

The methods disclosed in several method embodiments provided in the disclosure may be arbitrarily combined without conflicts, so as to obtain new method embodiments.

The features disclosed in several product embodiments provided in the disclosure may be arbitrarily combined without conflicts, so as to obtain new product embodiments.

The features disclosed in several method or device embodiments provided in the disclosure may be arbitrarily combined without conflicts, so as to obtain new method embodiments or device embodiments.

The above are only specific embodiments of the present disclosure, but the protection scope of the disclosure is not limited thereto. Any skilled in the art, within the technical scope disclosed by the present disclosure, may easily think of variations or replacements, which should be covered within the protection scope of the present disclosure. Therefore, the protection scope of the disclosure should be subject to the protection scope of the claims.

The invention claimed is:

1. A method for manufacturing a semiconductor structure, comprising:
    providing a substrate, wherein the substrate comprises a plurality of active areas;
    forming a plurality of bit line contact mask structures above the plurality of active areas, wherein each of the plurality of bit line contact mask structures at least covers one active area terminal;
    performing downward etching along the plurality of bit line contact mask structures to form a node contact hole in the active area terminal, and filling the node contact hole with a semiconductor material to form a first node contact structure; and
    forming a plurality of bit line structures above the plurality of active areas, and filling continuously gaps between the plurality of bit line structures with the semiconductor material until a second node contact structure is formed, wherein the first node contact structure and the second node contact structure collectively form a node contact structure.

2. The method for manufacturing the semiconductor structure according to claim 1, wherein forming the plurality of bit line contact mask structures above the plurality of active areas comprises:
    forming sequentially a functional structure layer, a mask layer, and a pattern layer above the plurality of active areas, the functional structure layer, the mask layer, and the pattern layer being stacked on one another;
    forming a plurality of preset patterns in the pattern layer, wherein the pattern layer is divided into a plurality of pillared structures by the plurality of preset patterns; and
    transferring the plurality of preset patterns to the functional structure layer through the mask layer, and removing the pattern layer and the mask layer, to obtain the plurality of bit line contact mask structures in the form of pillared structures.

3. The method for manufacturing the semiconductor structure according to claim 2, wherein the pattern layer at least comprises a photoresist layer.

4. The method for manufacturing the semiconductor structure according to claim 2, wherein the mask layer comprises a silicon oxynitride layer and a spin on hardmask layer.

5. The method for manufacturing the semiconductor structure according to claim 2, wherein the functional structure layer comprises a dielectric layer, a conductive layer, and a barrier layer.

6. The method for manufacturing the semiconductor structure according to claim 5, wherein the dielectric layer comprises silicon oxide, the conductive layer comprises polysilicon, and the barrier layer comprises silicon nitride.

7. The method for manufacturing the semiconductor structure according to claim 2, wherein the plurality of preset patterns comprise a first graphic array and a second graphic array, wherein the first graphic array comprises a plurality of elliptical shapes, and the second graphic array comprises a plurality of elliptical shapes, and the plurality of elliptical shapes in the first graphic array intersect with the plurality of elliptical shapes in the second graphic array.

8. The method for manufacturing the semiconductor structure according to claim 1, wherein performing downward etching along the plurality of bit line contact mask structures to form the node contact hole in the active area terminal comprises:
    forming a filling layer above the plurality of active areas, wherein the plurality of bit line contact mask structures are surrounded by the filling layer;
    etching the plurality of bit line contact mask structures to form a plurality of pillared holes in the filling layer; and
    etching continuously the active area terminal covered by a respective one of the plurality of bit line contact mask structures along a respective one of the plurality of pillared holes, to form the node contact hole in the active area terminal, wherein the node contact hole is in communication with the respective one of the plurality of pillared holes.

9. The method for manufacturing the semiconductor structure according to claim 8, wherein filling the node contact hole with the semiconductor material to form the first node contact structure comprises:
    filling the node contact hole with the semiconductor material through the respective one of the plurality of pillared holes until the plurality of pillared holes are closed by the semiconductor material; and
    etching the semiconductor material in the plurality of pillared holes, and retaining the semiconductor material in the node contact hole, to form the first node contact structure.

10. The method for manufacturing the semiconductor structure according to claim 9, wherein forming the plurality of bit line structures above the plurality of active areas comprises:
    filling the plurality of pillared holes with a mask material until the plurality of pillared holes are closed by the mask material;
    removing the filling layer to obtain a plurality of new bit line contact mask structures; and
    forming the plurality of bit line structures above the plurality of active areas based on the plurality of new bit line contact mask structures.

11. The method for manufacturing the semiconductor structure according to claim 10, wherein a covering layer, which is continuous, is provided on surfaces of the plurality of bit line structures, wherein filling continuously the gaps between the plurality of bit line structures with the semiconductor material comprises:

etching the covering layer at bottom portions of the gaps between the plurality of bit line structures to expose a surface of the first node contact structure; and filling continuously the gaps between the plurality of bit line structures with the semiconductor material, wherein the semiconductor material in the gaps between the plurality of bit line structures forms the second node contact structure.

12. The method for manufacturing the semiconductor structure according to claim 11, wherein a shallow trench isolation structure is provided between the plurality of active areas, wherein the method further comprises:

during etching the covering layer at the bottom portions of the gaps between the plurality of bit line structures, etching a portion of the shallow trench isolation structure and a portion of the first node contact structure, to increase a contact area between the second node contact structure and the first node contact structure.

13. The method for manufacturing the semiconductor structure according to claim 12, wherein the semiconductor material comprises polysilicon, the mask material comprises silicon oxynitride, and a material of the filling layer comprises silicon oxide.

14. A semiconductor structure, the semiconductor structure being manufactured by a method for manufacturing a semiconductor structure, the method for manufacturing the semiconductor structure comprising:

providing a substrate, wherein the substrate comprises a plurality of active areas;

forming a plurality of bit line contact mask structures above the plurality of active areas, wherein each of the plurality of bit line contact mask structures at least covers one active area terminal;

performing downward etching along the plurality of bit line contact mask structures to form a node contact hole in the active area terminal, and filling the node contact hole with a semiconductor material to form a first node contact structure; and forming a plurality of bit line structures above the plurality of active areas, and filling continuously gaps between the plurality of bit line structures with the semiconductor material until a second node contact structure is formed, wherein the first node contact structure and the second node contact structure collectively form a node contact structure.

15. A semiconductor memory, comprising a semiconductor structure, the semiconductor structure being manufactured by a method for manufacturing a semiconductor structure, the method for manufacturing the semiconductor structure comprising:

providing a substrate, wherein the substrate comprises a plurality of active areas;

forming a plurality of bit line contact mask structures above the plurality of active areas, wherein each of the plurality of bit line contact mask structures at least covers one active area terminal;

performing downward etching along the plurality of bit line contact mask structures to form a node contact hole in the active area terminal, and filling the node contact hole with a semiconductor material to form a first node contact structure; and forming a plurality of bit line structures above the plurality of active areas, and filling continuously gaps between the plurality of bit line structures with the semiconductor material until a second node contact structure is formed, wherein the first node contact structure and the second node contact structure collectively form a node contact structure.

* * * * *